US008305839B2

(12) United States Patent  
Tsern et al.

(10) Patent No.: US 8,305,839 B2  
(45) Date of Patent: *Nov. 6, 2012

(54) MEMORY DEVICE HAVING MULTIPLE POWER MODES

(75) Inventors: Ely K. Tsern, Los Altos, CA (US); Richard M. Barth, Palo Alto, CA (US); Craig E. Hampel, San Jose, CA (US); Donald C. Stark, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/352,177

(22) Filed: Jan. 17, 2012

(65) Prior Publication Data

US 2012/0113738 A1 May 10, 2012

Related U.S. Application Data

(63) Continuation of application No. 12/975,332, filed on Dec. 21, 2010, now Pat. No. 8,248,884, which is a continuation of application No. 12/608,209, filed on Oct. 29, 2009, now Pat. No. 7,986,584, which is a continuation of application No. 11/107,504, filed on Apr. 15, 2005, now Pat. No. 7,626,880, which is a continuation of application No. 10/742,327, filed on Dec. 18, 2003, now Pat. No. 7,320,082, which is a continuation of application No. 09/887,181, filed on Jun. 21, 2001, now Pat. No. 6,701,446, which is a continuation of application No. 09/169,378, filed on Oct. 9, 1998, now Pat. No. 6,263,448.

(60) Provisional application No. 60/061,664, filed on Oct. 10, 1997.

(51) Int. Cl.  
*G11C 8/18* (2006.01)

(52) U.S. Cl. ............. 365/233.15; 365/233.16; 365/226; 365/227

(58) Field of Classification Search ............. 365/233.15, 365/233.16, 226, 227  
See application file for complete search history.

(56) References Cited

U.S. PATENT DOCUMENTS 4,293,932 A   10/1981   McAdams ................ 365/222  
(Continued)

FOREIGN PATENT DOCUMENTS

EP   0112140 A1   6/1984  
(Continued)

OTHER PUBLICATIONS

Bursky, "Memory-CPU Interface Speeds Up Data Transfers," Electronic Design, pp. 137-142, Mar. 19, 1992.

(Continued)

*Primary Examiner* — Vu Le  
*Assistant Examiner* — Han Yang  
(74) *Attorney, Agent, or Firm* — Morgan, Lewis & Bockius LLP

(57) ABSTRACT

A memory device having a memory core is described. The memory device includes a clock receiver circuit, a first interface to receive a read command, a data interface, and a second interface to receive power mode information. The data interface is separate from the first interface. The second interface is separate from the first interface and the data interface. The memory device has a plurality of power modes, including a first mode in which the clock receiver circuit, first interface, and data interface are turned off; a second mode in which the clock receiver is turned on and the first interface and data interface are turned off; and a third mode in which the clock receiver and first interface are turned on. In the third mode, the data interface is turned on when the first interface receives the command, to output data in response to the command.

33 Claims, 9 Drawing Sheets

U.S. PATENT DOCUMENTS

| | | | |
|---|---|---|---|
| 4,334,295 A | 6/1982 | Nagami | 365/222 |
| 4,388,686 A | 6/1983 | Haid | 364/200 |
| 4,484,308 A | 11/1984 | Lewandowski | 364/900 |
| 4,485,461 A | 11/1984 | Kobayashi | 365/239 |
| 4,528,661 A | 7/1985 | Baher et al. | |
| 4,617,647 A | 10/1986 | Hoshi | 365/189 |
| 4,649,522 A | 3/1987 | Kirsch | 365/189 |
| 4,694,197 A | 9/1987 | Sprague | 307/269 |
| 4,734,880 A | 3/1988 | Collins | 364/900 |
| 4,744,062 A | 5/1988 | Nakamura et al. | |
| 4,792,926 A | 12/1988 | Roberts | |
| 4,792,929 A | 12/1988 | Olson et al. | 365/233 |
| 4,800,530 A | 1/1989 | Itoh et al. | 365/189 |
| 4,823,324 A | 4/1989 | Taylor | 365/230 |
| 4,825,411 A | 4/1989 | Hamano | 365/189 |
| 4,831,597 A | 5/1989 | Fuse | 365/233 |
| 4,833,656 A | 5/1989 | Tobita | 365/230.06 |
| 4,839,856 A | 6/1989 | Tanaka | 364/900 |
| 4,875,192 A | 10/1989 | Matsumoto | 365/193 |
| 4,901,282 A | 2/1990 | Kobayashi | 365/222 |
| 4,970,690 A * | 11/1990 | Sherman | 365/189.02 |
| 4,979,145 A | 12/1990 | Remington et al. | 364/900 |
| 5,007,028 A | 4/1991 | Ohshima | 365/233 |
| 5,034,917 A | 7/1991 | Bland et al. | 364/900 |
| 5,077,693 A | 12/1991 | Hardee et al. | 365/230.08 |
| 5,083,296 A | 1/1992 | Hara et al. | 365/230.02 |
| 5,088,062 A | 2/1992 | Shikata | 365/189.05 |
| 5,111,386 A | 5/1992 | Fujishima et al. | 395/425 |
| 5,124,589 A | 6/1992 | Shiomi et al. | 307/465 |
| 5,150,329 A | 9/1992 | Hoshi | 365/222 |
| 5,173,878 A | 12/1992 | Sakui | 365/230.02 |
| 5,179,687 A | 1/1993 | Hidaka et al. | 395/425 |
| 5,185,719 A | 2/1993 | Dhong | 365/189.01 |
| 5,193,072 A | 3/1993 | Frenkil | 365/222 |
| 5,202,857 A | 4/1993 | Yanai | 365/233 |
| 5,218,572 A | 6/1993 | Lee | 365/200 |
| 5,218,686 A | 6/1993 | Thayer | 395/425 |
| 5,226,147 A | 7/1993 | Fujishima et al. | 395/425 |
| 5,249,277 A | 9/1993 | Leftwich | 395/400 |
| 5,249,282 A | 9/1993 | Segers | 395/425 |
| 5,251,178 A | 10/1993 | Childers | |
| 5,258,953 A | 11/1993 | Tsujimoto | 365/200 |
| 5,260,905 A | 11/1993 | Mori | 365/230.05 |
| 5,267,200 A | 11/1993 | Tobita | 365/189.05 |
| 5,268,639 A | 12/1993 | Gasbarro | |
| 5,268,865 A | 12/1993 | Takasugi | 365/189.05 |
| 5,274,788 A | 12/1993 | Koike | 395/425 |
| 5,276,858 A | 1/1994 | Oak et al. | 395/550 |
| 5,278,789 A | 1/1994 | Inoue | 365/189.01 |
| 5,278,792 A | 1/1994 | Inoue | 365/193 |
| 5,287,327 A | 2/1994 | Takasugi | 365/230.02 |
| 5,291,444 A | 3/1994 | Scott | 365/189.05 |
| 5,293,340 A | 3/1994 | Fujita | 365/201 |
| 5,299,169 A | 3/1994 | Miyamoto | 365/230.05 |
| 5,305,278 A | 4/1994 | Inoue | 365/230.03 |
| 5,307,320 A | 4/1994 | Farrer et al. | 365/230.01 |
| 5,307,469 A | 4/1994 | Mann | 395/425 |
| 5,311,483 A | 5/1994 | Takasugi | 365/233 |
| 5,335,206 A | 8/1994 | Kawamoto | |
| 5,337,285 A | 8/1994 | Ware et al. | |
| 5,359,722 A | 10/1994 | Chan | |
| 5,384,737 A | 1/1995 | Childs et al. | |
| 5,432,468 A | 7/1995 | Moriyama et al. | |
| 5,440,515 A | 8/1995 | Chang et al. | |
| 5,444,667 A | 8/1995 | Ohara | |
| 5,452,401 A | 9/1995 | Lin | |
| 5,455,923 A | 10/1995 | Kaplinsky | |
| 5,457,790 A | 10/1995 | Iwamura | |
| 5,471,425 A | 11/1995 | Yumitori et al. | |
| 5,471,607 A | 11/1995 | Garde | |
| 5,481,731 A | 1/1996 | Conary | |
| 5,498,990 A | 3/1996 | Leung | |
| 5,524,249 A | 6/1996 | Suboh | |
| 5,566,108 A | 10/1996 | Kitamura et al. | 365/233 |
| 5,579,263 A | 11/1996 | Teel et al. | |
| 5,581,512 A | 12/1996 | Kitamura | |
| 5,585,745 A | 12/1996 | Simmons et al. | |
| 5,586,332 A | 12/1996 | Jain | |
| 5,598,376 A | 1/1997 | Merritt et al. | |
| 5,615,169 A | 3/1997 | Leung | |
| 5,615,376 A | 3/1997 | Ranganathan | 395/750 |
| 5,623,677 A | 4/1997 | Townsley et al. | |
| 5,625,796 A | 4/1997 | Kaczmarczyk | 395/495 |
| 5,629,897 A | 5/1997 | Iwamoto | |
| 5,655,113 A | 8/1997 | Leung et al. | |
| 5,666,322 A | 9/1997 | Conkle | |
| 5,666,324 A | 9/1997 | Kosugi | |
| 5,673,398 A | 9/1997 | Takeda | |
| 5,677,849 A | 10/1997 | Smith | |
| 5,687,183 A | 11/1997 | Chestley | |
| 5,696,729 A | 12/1997 | Kitamura | |
| 5,726,650 A | 3/1998 | Yeoh et al. | |
| 5,742,194 A | 4/1998 | Saeki | |
| 5,754,838 A | 5/1998 | Shibata et al. | |
| 5,758,132 A | 5/1998 | Strahlin | |
| 5,768,213 A | 6/1998 | Jung et al. | |
| 5,790,839 A | 8/1998 | Luk | |
| 5,793,227 A | 8/1998 | Goldrian | |
| 5,796,673 A | 8/1998 | Foss | |
| 5,796,995 A | 8/1998 | Nasserbakht et al. | |
| 5,802,356 A | 9/1998 | Gaskins et al. | |
| 5,815,462 A | 9/1998 | Konishi | |
| 5,815,693 A | 9/1998 | McDermott et al. | |
| 5,822,255 A | 10/1998 | Uchida | |
| 5,845,108 A | 12/1998 | Yoo et al. | |
| 5,860,125 A | 1/1999 | Reents | |
| 5,880,998 A | 3/1999 | Tanimura | |
| 5,884,100 A | 3/1999 | Normoyle et al. | |
| 5,886,946 A | 3/1999 | Ooishi | |
| 5,890,195 A | 3/1999 | Rao | |
| 5,910,930 A | 6/1999 | Dieffenderfer | |
| 5,917,760 A | 6/1999 | Millar | |
| 5,918,058 A | 6/1999 | Budd | |
| 5,930,197 A | 7/1999 | Ishibashi | |
| 5,955,904 A | 9/1999 | Kawasaki | |
| 5,987,620 A | 11/1999 | Tran | |
| 6,014,339 A | 1/2000 | Kobayashi | |
| 6,037,813 A | 3/2000 | Eto et al. | |
| 6,088,774 A | 7/2000 | Gillingham | |
| 6,128,700 A | 10/2000 | Hsu | |
| 6,134,638 A | 10/2000 | Olarig et al. | |
| 6,209,071 B1 | 3/2001 | Barth et al. | |
| 6,226,723 B1 | 5/2001 | Gustavson | |
| 6,259,288 B1 | 7/2001 | Nishimura | |
| 6,263,448 B1 | 7/2001 | Tsern et al. | |
| 6,442,644 B1 | 8/2002 | Gustavson et al. | |
| 7,593,285 B2 | 9/2009 | Cho | |
| 2008/0291749 A1 | 11/2008 | Kishimoto et al. | |
| 2009/0091987 A1 | 4/2009 | Butt et al. | |
| 2010/0138684 A1* | 6/2010 | Kim et al. | 713/601 |

FOREIGN PATENT DOCUMENTS

| | | |
|---|---|---|
| EP | 0308132 | 3/1989 |
| EP | 308132 A2 | 3/1989 |
| EP | 552975 A2 | 7/1993 |
| EP | 94112140.2 | 3/1994 |
| EP | 0638858 A1 | 2/1995 |
| EP | 96308132.8 | 11/1996 |
| EP | 0778575 A2 | 6/1997 |
| JP | 61-160129 A | 7/1986 |
| JP | 61-160130 A | 7/1986 |
| JP | 61-245255 | 10/1986 |
| JP | 62-135949 | 6/1987 |
| JP | 1-163849 A | 6/1989 |
| JP | 6-103153 | 4/1994 |
| JP | 09 034580 | 2/1997 |

OTHER PUBLICATIONS

Choi, "16Mbit Synchronous DRAM with 125Mbyte/sec Data Rate," Symposium on VLSI Circuits, Digest of Technical Papers, pp. 65-66, 1993.

Gary et al., "The PowerPC™ 603 Microprocessor: A Low-Power Design for Portable Applications," IEEE Design & Test of Computers, Winter, 1994.

Gillingham, "SLDRAM Architectural and Functional Overview," SLDRAM Consortium, Aug. 29, 1997.

Han, "Skew Minimization Techniques for 256M-bit Synchronous DRAM and beyond," 1996 Symposium on VLSI Circuits Digest of Technical Papers, 1996.
Horowitz, "PLL Design for a 500 MB/s Interface," 1993 IEEE International Solid-State Circuits Conference, Digest of Technical Papers, Feb. 25, 1993.
Kodama, "A 150-MHz 4-Bank 64M-bit SDRAM with Address Incrementing Pipeline Scheme," 1994 Symposium on VLSI Circuits Digest of Technical Papers, 1994.
Kushiyama, "A 500-Megabyte/s Data-Rate 4.5M DRAM," IEEE Journal of Solid-State Circuits, vol. 28 No. 4, Apr. 1993.
Kushiyama, "500Mbyte/sec Data-Rate 512 Kbits×9 DRAM Using a Novel I/O Interface," 1992 Symposium on VLSI Circuits Digest of Technical Papers, 1992.
Lee et al., "A 2.5 V CMOS Delay-Locked Loop for an 18 Mbit, 500 Megabyte/s DRAM," J. of Solid State Circuits, vol. 29, No. 12, pp. 1491-1496, Dec. 1994.
Lee et al., "A 80ns 5V-Only Dynamic RAM," ISSCC Digest of Technical Papers, Feb. 1979, pp. 142-143.
Lines et al., "High Speed Circuit Techniques in a 150Hz 64M SDRAM," Proceedings of Memory Technology, Design & Testing Int'l Workshop, San Jose, California, Aug. 11, 1997, pp. 8-11.
Nicol, "A Scalable Pipelined Architecture for Fast Buffer SRAM's," IEEE Journal of Solid-State Circuits, vol. 31, No. 3, Mar. 1996.
Saeki et al., "A 2.5ns Clock Access, 250MHz 256Mb SDRAM with Synchronous Mirror Delay," IEEE ISSCC Digest of Technical Papers, pp. 374-375, 476, 1996.
Sakai, "A Synchronous DRAM with New High-Speed I/O Lines Method for the Multimedia Age," IEICI Trans. Electron., vol. E78-C, No. 7, Jul. 1995.
Takai, "250 Mbyte/s Synchronous DRAM Using a 3-Stage-Pipelined Architecture," IEEE Journal of Solid-State Circuits, vol. 29, No. 4, Apr. 1994.
Yoo, "A 150HMz 8-Banks 256M Synchronous DRAM with Wave Pipelining Methods," 1995 IEEE International Solid-State Circuits Conference, Digest of Technical Papers, Feb. 17, 1995.
IEEE, "Draft Standard for a High-Speed Memory Interface (SyncLink)", 1996.
"IEEE Standard for High-Bandwidth Memory Interface Based on Scalable Coherent Interface SCI Signaling Technology (RamLink)" 1996.
MoSys, Inc., "MD904 to MD920, ½ to 2 MByte Multibank® DRAM (DRAM9®)" MoSys Data Sheet, Feb. 21, 1997.
Rambus, Inc., "NEC 18Mb Rambus DRAM Core Interface," Aug. 9, 1992.
Rambus Inc., "p5 18Mb RDRAM Test Modes," Aug. 3, 1992.
Rambus, Inc., "Rambus Interface Technical Description" Jan. 20, 1992.
Rambus, Inc., "Rambus Interface Technical Description," Aug. 18, 1992.
Rambus, Inc., "RDRAM Design Guide," Apr. 20, 1995.
Rambus Inc, $8/9$-Mbit (1M×$8/9$) and $16/18$ (2M×$8/9$) RDRAM Data Sheet, Mar. 1996.
Rambus Inc., "$16/18$Mbit (2M×$8/9$) & $64/72$Mbit (8M×$8/9$) Concurrent RDRAM Data Sheet," Jul. 1996, pp. 1-61.
SLDRAM Consortium Data Sheet, "400 Mb/s/pin SLDRAM Advance Data Sheet," Aug. 27, 1997.
SyncLink Consortium, "SyncLink Feasibility v1.1," Apr. 30, 1996.
"Chips & Technologies: Chips Introduces First IBM," Jul. 20, 1987, del 30-compatible Visi Chipset.
JC-42.3 Executive Committee Meeting No. 75, May 24, 1995, New Orleans.
Minutes of meeting and presentations made at JC-42.3 Committee on RAM Memories, Meeting No. 75, May 24, 1995, New Orleans.
Minutes of meeting and presentations made at JC-42.3 Committee on RAM Memories, Meeting No. 76, Sep. 11, 1995, Crystal City, VA.
International Search Report for International Application No. PCT/US98/21449, Mar. 4, 1999.
Office Action dated Apr. 16, 2008 for related U.S. Appl. No. 11/856,661.
Samsung Electronics Inc., "KMM377S1620CT2 SDRAM Module Datasheet," Rev. 1 (Nov. 1998), Preliminary, pp. 1-12. 12 pages.
Micron Semiconductor, Inc., "Synchronous DRAM, 4MEG×4SDRAM, Pulsed RAS, Dual Bank, BURST Mode, 3.3V, Self Refresh, Advance," 1994, pp. 2-1 through 2-84, 85 pgs.
Texas Instruments, Inc., "TMS626402, 2097 152-Word by 2-Bank Synchronous Dynamic Random-Access Memory," Feb. 1994, pp. 5-3-5-23, 12 pgs.
JC-42.3 Task Group Minutes, "Meeting on Synchronous DRAM Ballouts," Las Vegas, Nevada, Jan. 21, 1993, 19 pgs.
Saeki, Takanori, et al., "SP 23.4: A 2.5 ns Clock Access 250 MHZ 256Mb SDRAM with a Synchronous Mirror Delay," IEEE ISSCC Digest of Technical Papers, p. 374-375, 476, Feb. 10, 1996.
NEC Corporation, "16Mbit Synchronous DRAM, Preliminary Data Sheet, Ver. 2.0," Jul. 20, 1992, 31 pgs.

* cited by examiner

MEMORY DEVICE HAVING MULTIPLE POWER MODES

RELATED APPLICATION

This application is a continuation of U.S. patent application Ser. No. 12/975,322, filed Dec. 21, 2010, now U.S. Pat. No. 8,248,884 which is a continuation of U.S. patent application Ser. No. 12/608,209, filed Oct. 29, 2009, now U.S. Pat. No. 7,986,584, which is a continuation of U.S. patent application Ser. No. 11/107,504, filed Apr. 15, 2005, now U.S. Pat. No. 7,626,880, which is continuation of U.S. patent application Ser. No. 10/742,327 filed Dec. 18, 2003, now U.S. Pat. No. 7,320,082, which is a continuation of U.S. patent application Ser. No. 09/887,181 filed Jun. 21, 2001, now U.S. Pat. No. 6,701,446, which is a continuation of U.S. patent application Ser. No. 09/169,378, filed Oct. 9, 1998, now U.S. Pat. No. 6,263,448, which claims the benefit of U.S. Provisional Application Ser. No. 60/061,664 filed Oct. 10, 1997, which are incorporated by reference in their entirety.

A related application was filed on May 7, 1996, Ser. No. 08/648,300, entitled "Asynchronous Request/Synchronous Data Dynamic Random Access Memory", assigned to the same assignee as this application, hereby incorporated by reference as background information.

BACKGROUND OF THE INVENTION

The present invention relates to power domains, and in particular to clock power domains in memory systems such as dynamic random access memories (DRAMs).

Power consumption is a constraint on computer systems both by virtue of limited power available in portable, battery-operated systems, and also limited heat dissipation for high power devices. As devices are made faster by increasing their clock speed, the power requirements also increase since clock signal lines, receivers, and other clock circuits consume more power and generate more heat as device clock rates increase.

Some memory systems operate asynchronously. Other memory systems, to increase the speed and bandwidth, operate synchronously using a clock signal. For these synchronous systems, clock power becomes an important issue at high frequencies. High power consumption by the clock signal can exceed thermal cooling limits of the package or system or cause excessive battery drain in portable devices.

In a prior Rambus dynamic random access memory (DRAM) system, illustrated in FIG. 1, three clock domains are used to control clock power use. FIG. 1 shows a memory core 11 and a memory interface 13. A first domain consists of the control circuitry 15, and a second domain is the write path 17 into the memory core. A third path is read data path 19. Table 1 indicates which clock domains are on for different power modes. The clock power to all three domains can be turned off in a standby mode. The control domain is turned on to enter an active mode. The write data path 17 is additionally turned on when needed for a write operation, an active write mode. Read data path 19 is turned on for a read operation, an active read mode. In a read operation, the control domain is turned on first, to allow the control signals for the read to be provided to the memory core. Since there will be some delay before the data is available, the output data path for the data to be read need not have its clock turned on until some period of time later. Thus, there is a latency between when the control logic is turned on and provided the clock signal to when the read data output path is turned on.

TABLE 1

| power modes | Clock Domains | | |
| --- | --- | --- | --- |
| | rclk | sclk | tclk |
| standby | off | off | off |
| active | on | off | off |
| active read | on | off | on |
| active write | on | on | off |

In a prior Rambus system, the read data path is turned on automatically by the control logic when the control logic is activated for a read. Thus, a separate control signal does not need to be sent over the interface to turn on the read data path. A register will store a count corresponding to the latency from a RAS control signal to when read data will be available from the memory core, and this register value is used to control the latency of the clock turn-on for the read data path.

One disadvantage of the prior Rambus system is the additional latency required for turning on the control logic to exit the standby power mode. Since the interface control logic and datapath must be on before an incoming command can be processed and a memory operation started, the turn-on latency of the control logic and datapath directly adds to the memory access latency. This provides a power versus latency trade off.

Another method of limiting clock power consumption is to use a slower clock signal. This is done in microprocessors which have a low power or sleep mode. Typically, these are used in laptop computers in which the user can select a lower power mode, or the laptop will automatically enter the lower power or sleep mode in the absence of any user input within a predefined period of time.

SUMMARY OF THE INVENTION

The present invention provides a memory device with multiple clock domains. Separate clocks to different portions of the control circuitry create different clock domains. The different domains are sequentially turned on as needed to limit the power consumed. The turn on time of the domains is overlapped with the latency for the memory access to make the power control transparent to the user access of the memory core.

In one embodiment, the present invention separates out the RAS control logic into a separate clock domain from the CAS control logic. This smaller amount of RAS control logic can then be left on in a standby power mode to eliminate any visible latency from a RAS signal through to data access.

The write and read data paths are also in separate clock domains to further conserve power depending upon whether an operation is a read or write operation.

In one embodiment, the power control is implicit and transparent to the user. In a standby mode, a RAS signal will cause the control logic associated with the RAS control logic to activate the CAS clock domain an appropriate latency after receipt of the RAS signal without any further control over the memory interface required. When a CAS read or write signal is received, that will implicitly, or automatically, cause the read or write clock domain to be turned on an appropriate latency after the CAS signal.

In yet another embodiment of the invention, the memory device can dynamically switch between a fast and a slow clock depending upon the needed data bandwidth. The data bandwidth across the memory interface can be monitored by the memory controller, and when it drops below a certain threshold, a slower clock can be used. The clock speed can be dynamically increased as the bandwidth demand increases.

Thus, rather than a coarse switch between a slow or fast clock speed depending upon user activity, clock speed can be switched automatically depending upon data access bandwidth requirements.

For a further understanding of the nature and advantages of the invention, reference should be made to the following description taken in conjunction with the accompanying drawings.

DETAILED DESCRIPTION OF THE PREFERRED EMBODIMENTS

Figure 1:
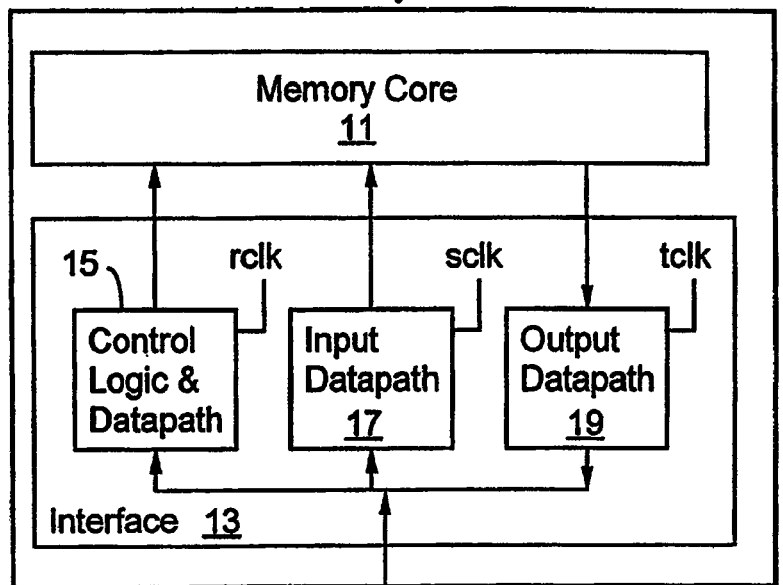
FIG. 1 is a block diagram of a prior art memory system with multiple clock domains.
Figure 2A:
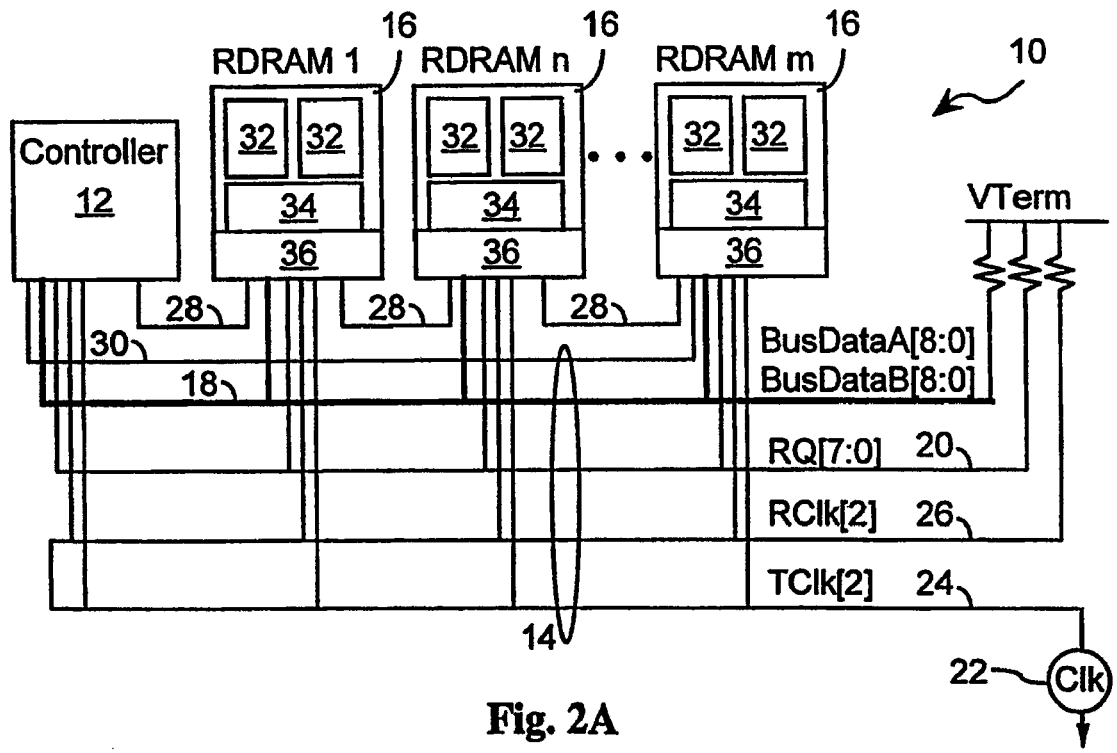
FIG. 2A is a block diagram of a memory system according to one embodiment of the invention.

FIG. 2A shows a memory system 10 which is controlled by a controller 12 over an interconnect bus 14 to a series of RDRAMs (Rambus dynamic random access memories) 16. The interconnect bus 14 includes two nine bit data busses 18 (BusDataA and BusDataB), and an eight bit primary control bus (RQ) 20. A clock 22 is provided in one direction along a transmit line 24 (TClk), and loops back along a receive clock line 26 (RClk).

In addition a low power, serial daisy-chained control interface is provided with daisy-chained segments 28 and a return segment 30. In other embodiments, the control sideband 28, 30 may be a bus instead of daisy-chained. In a powered down or nap mode, the primary control bus and data busses can be turned off with communication being initiated using the control sideband 28, 30.

Each RDRAM 16 includes multiple banks 32 of memory, each with associated core control logic 34. In addition, each chip includes interconnect logic 36.

Figure 2B:
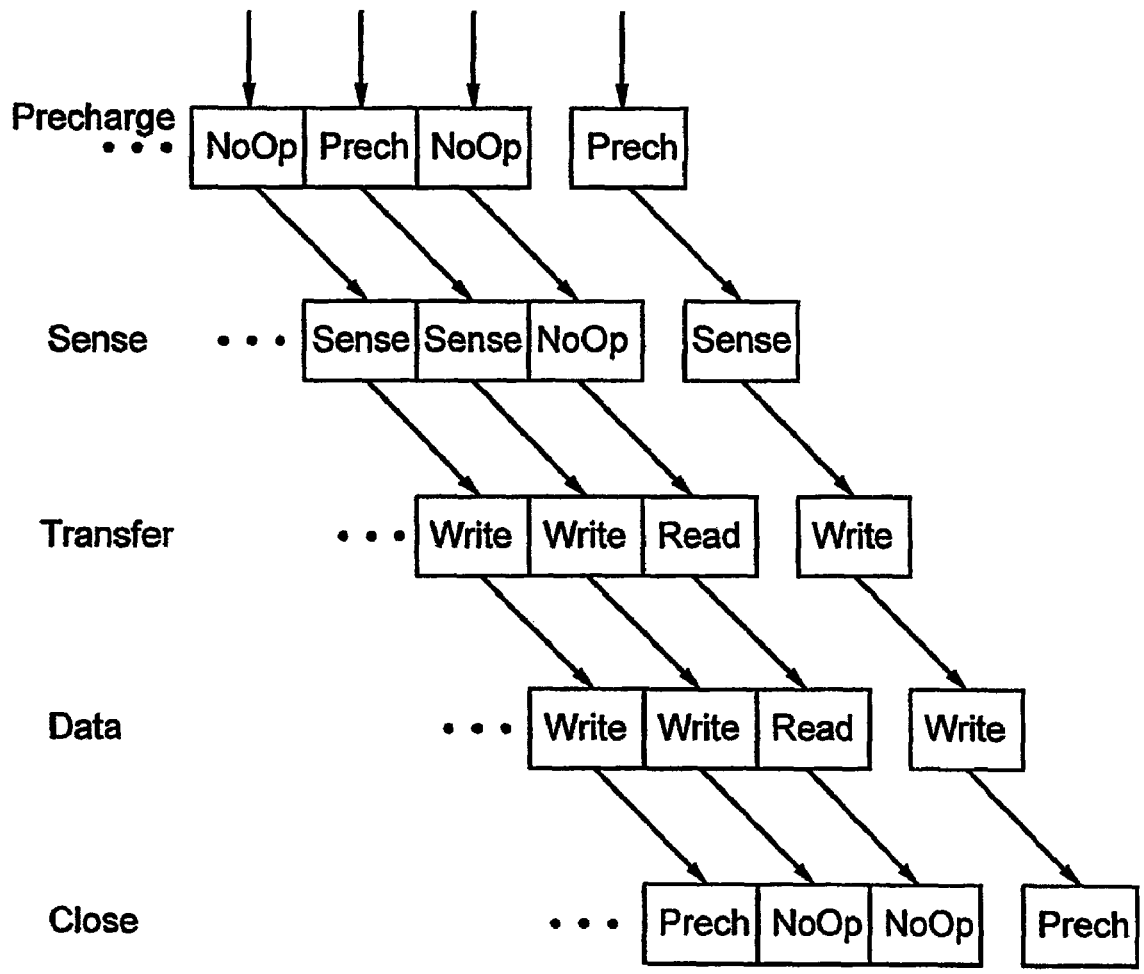
FIG. 2B is a diagram illustrating memory operation pipelining in accordance with the invention.

FIG. 2B illustrates the pipelining of memory operations used in the present invention. As can be seen, the memory operations are broken up into five steps: precharge, sense, transfer, data and close. By breaking up the control and data transfer of a memory access operation in this manner, the operations can be pipelined to increase throughput. For a further description of the pipelining according to the invention, reference should be made to co-pending application Ser. No. 09/169,526, entitled "Apparatus and Method for Pipeline Memory Operations", filed Oct. 9, 1998 and assigned to the same assignee, incorporated herein by reference.

Figure 3:
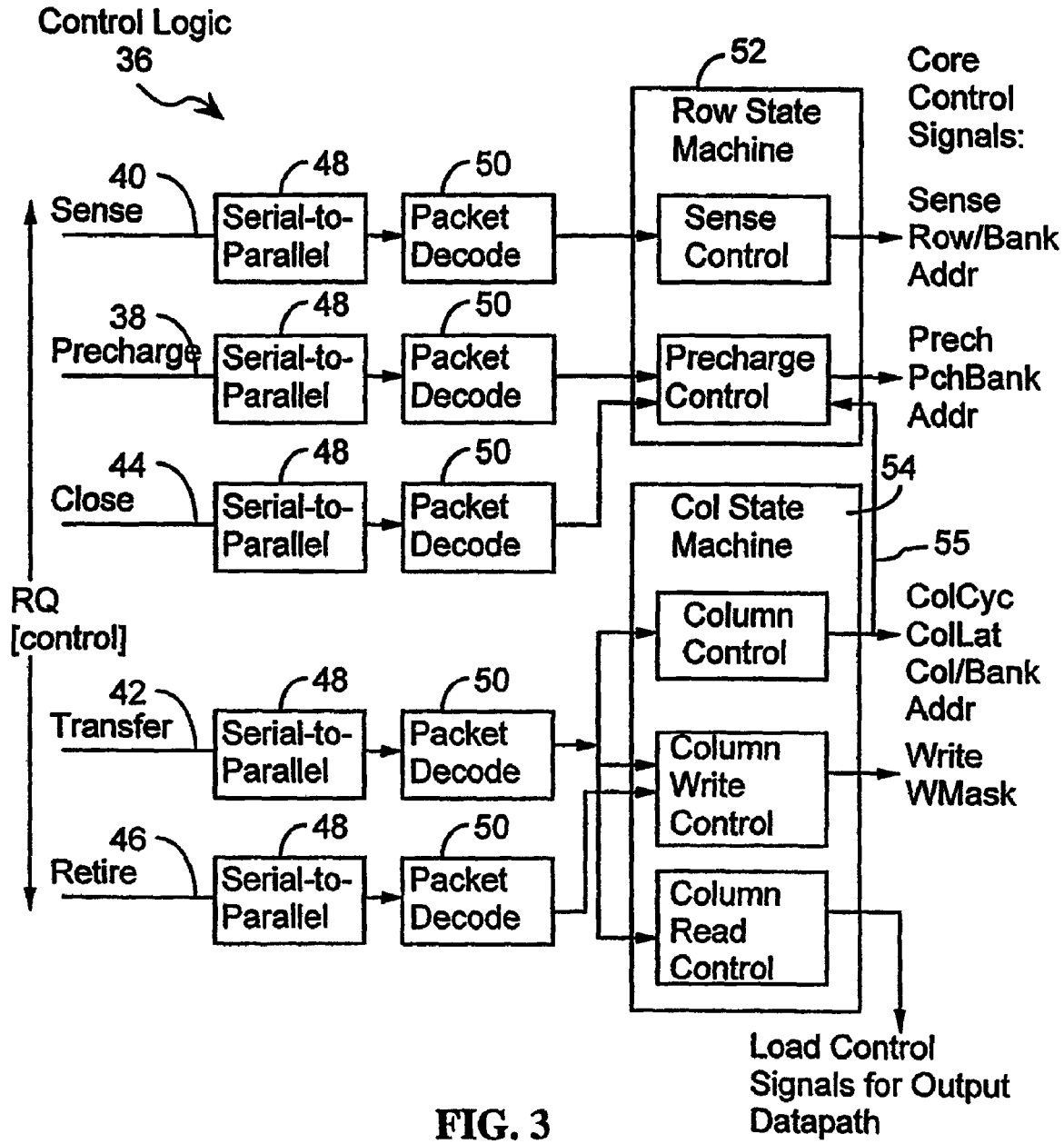
FIG. 3 is a block diagram of one embodiment of the segmentation of the control logic into clock domains according to the access pipelining of FIG. 2.

FIG. 3 is a diagram illustrating one embodiment of interconnect logic 36 in a RDRAM. As can be seen, the control logic is broken up into segments, corresponding to the pipeline stages of FIG. 2B. In particular, there is a pre-charge input 38, a sense input 40, a transfer input 42, and a close input 44. The data pipeline of FIG. 2B is not shown, since FIG. 3 shows only control logic. FIG. 3 additionally shows a retire input 46. This retire input is used for a two-stage write operation, in which data is first written to an internal buffer, and is then written from the buffer into the memory core upon receipt of a "retire" command from the memory controller.

Each of the control inputs is provided on a serial line which is converted into parallel with a respective converter 48. The control signals are sent as a packet, which is decoded in respective packet decode logic 50. From there, decoded control signals are sent to either a row state machine 52, or a column state machine 54. The state machine will then send the appropriate control signals to the memory core control logic.

Not all of the control logic segments shown in FIG. 3 need to be operating at the same time. Even in a tightly pipelined operation, if reads and writes are alternating, for example, only one of the column read and column write control logic needs to be operating each cycle. Accordingly, each of the segments of FIG. 3 can be made a separate clock domain, with the clock to the domain turned on and off as necessary.

The turning off of clock domains as they are not needed significantly reduces power consumption and heat generation of the memory chip. As will be described below with respect to FIGS. 5 and 6, turning on and off of each clock domain is done with timing such that it is transparent to a memory access. In other words, the memory access will take no more time to complete than if all the clocks were left on all the time. An example of how the latency of the clock domain turn on is hidden behind the normal latency of the pipeline is set forth below with respect to FIGS. 5 and 6.

In one embodiment, a sense operation turns on the clock domain for both the precharge control and close logic. A transfer operation (by the column control logic, also sometimes called the CAS control logic) turns on the retire logic (i.e., labeled the column write control logic in FIG. 3). A precharge operation can turn on the column control logic, or parts of it. Signal line 55 in FIGS. 3 and 4 indicates that the control column logic activates the precharge control logic so as to restart precharging (i.e., of the sense amplifiers in the memory core) after the column state machine 54 has completed transfer of information between the sense amplifiers and the data input/output buffers.

Implicit control is also used to turn off clock domains not needed for later steps in a particular operation sequence. For example, a close operation can turn off secondary control domains, such as the transfer and retire logic in the column state machine.

Figure 4:
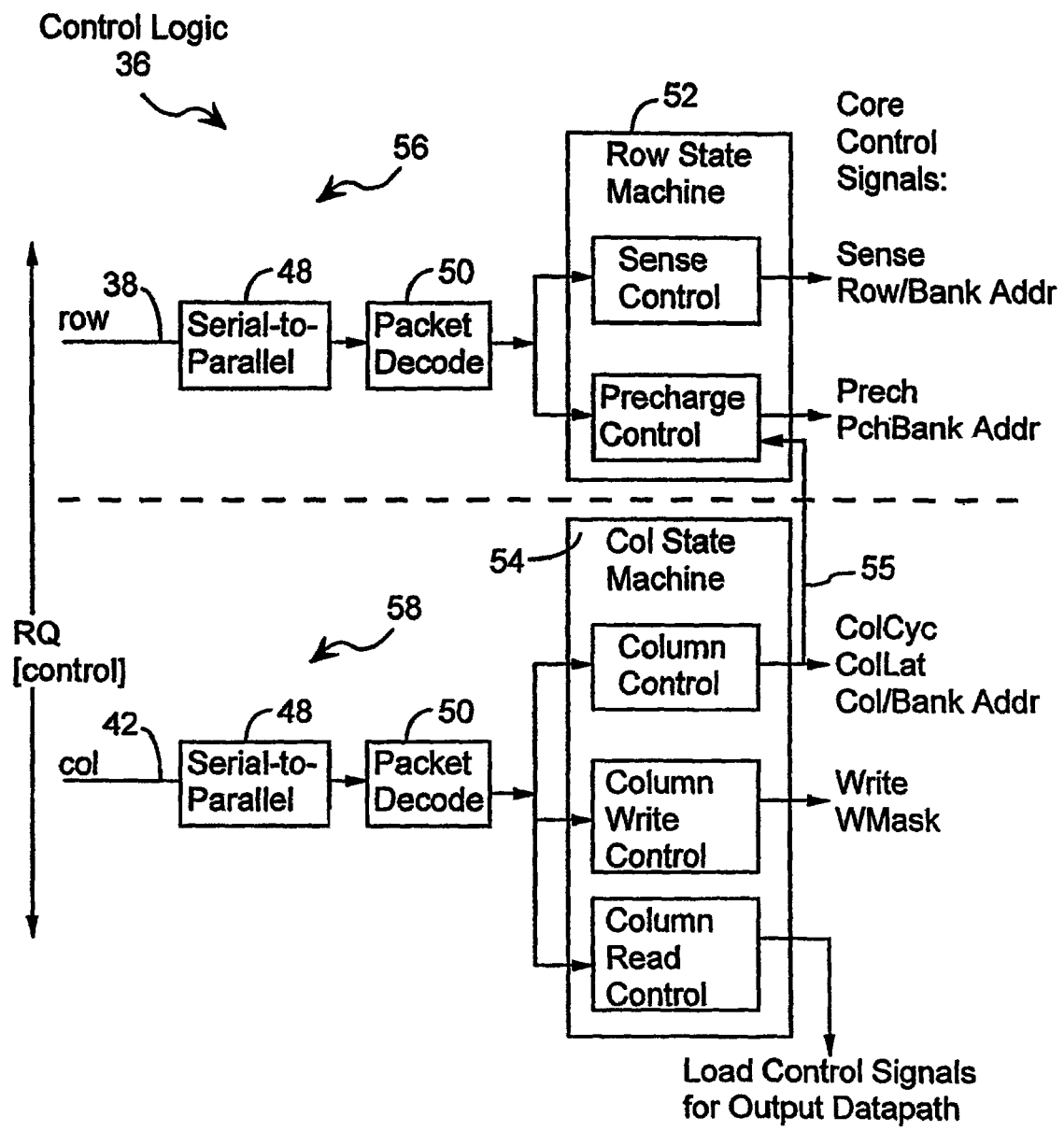
FIG. 4 is a block diagram of an alternate embodiment of FIG. 3 wherein the control logic is broken into two clock domains.

FIG. 4 shows an alternate embodiment of the invention in which the control logic 36 is broken down into two clock domains, sense clock domain 56 and column clock domain 58. Row clock domain 56 receives and processes row control packets while column clock domain 58 receives and processes column control packets. Row control packets specify a row address and bank address for a sense operation (also known as a RAS operation), while the column control packets indicate column address and the type of column access operation (e.g., read or write), also known as a CAS operation, to be performed. Such an embodiment reflects a balance between the complexity and cost of more clock domains and the benefits of additional power savings. This embodiment recognizes that the major power savings is achieved by separating the RAS and CAS control operations.

Figure 5:
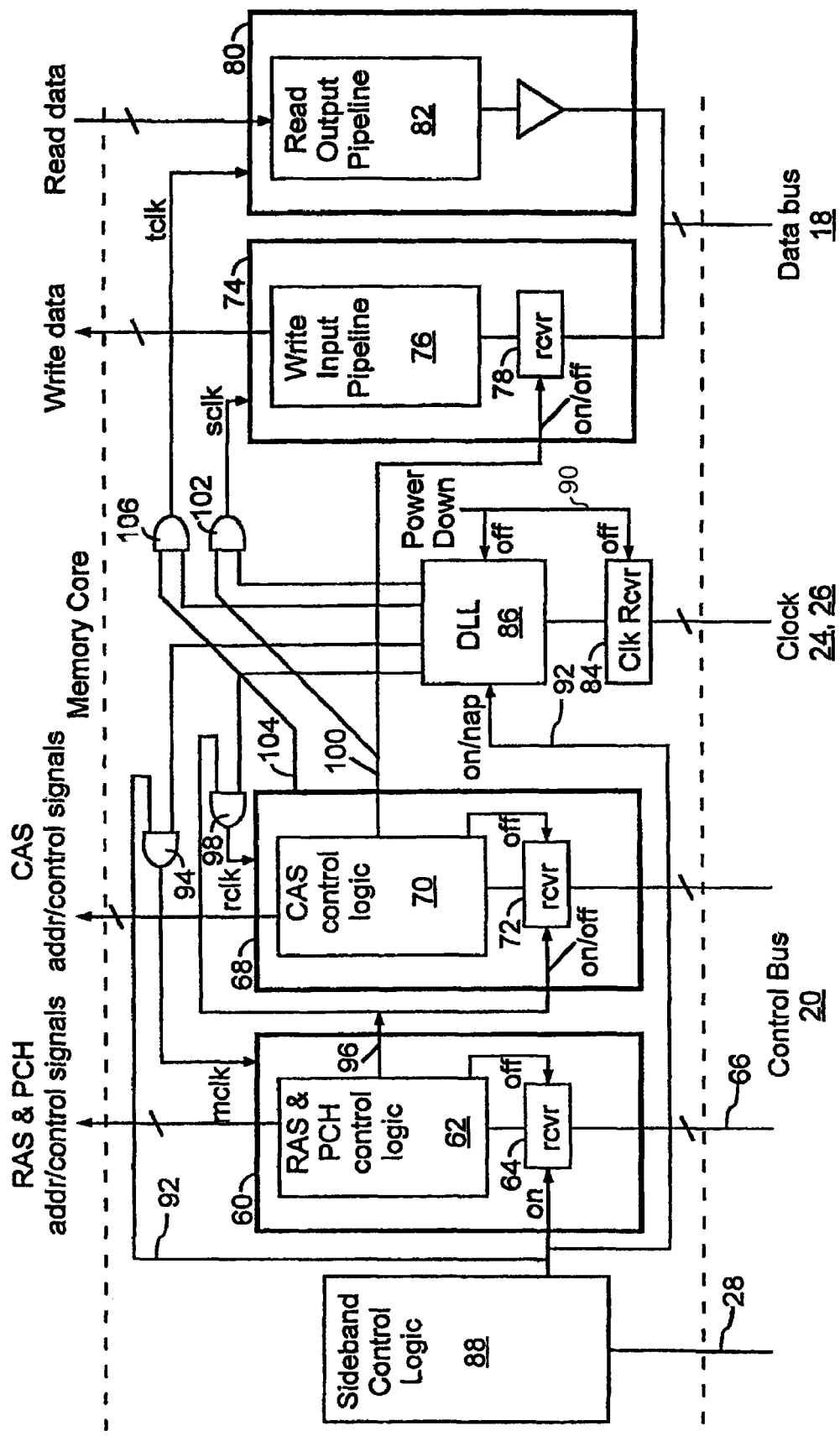
FIG. 5 is a block diagram of multiple control and data access clock domains according to one embodiment of the invention.

FIG. 5 is a block diagram of one embodiment of the invention illustrating the different clock domains. FIG. 5 shows a RAS clock domain 60 including control logic 62 for the RAS signal and PCH (precharge) control logic. In addition, a clock receiver 64 is shown which connects to control bus line 66.

A second, CAS clock domain 68 includes CAS control logic 70 and a receiver 72. A write data clock domain 74 includes a write input pipeline 76 and a receiver 78. A read clock domain 80 includes a read output pipeline 82.

In the middle of FIG. 5 is shown a clock receiver 84 for the main clock used for the main control bus, lines 24 and 26 of FIG. 2A. This clock is synchronized with a delay lock loop (DLL) 86. Finally, a sideband control logic block 88 is shown.

In operation, sideband control logic 88 will always be on, even in a power down mode. In a power down mode, DLL 86 and clock receiver 84 can be turned off via a control line 90. Because of the significant latency required to turn on clock receiver 84 and DLL 86, an intermediate power mode, called a "nap" mode is used in which receiver 84 is on, but DLL 86 is in a low power configuration that provides faster synchronization time than when the DLL is entirely off. When in the nap mode, a memory access can be initiated with an appropriate control signal over sideband control line 28.

In an alternate embodiment, the sideband control logic 88 also receives RAS, or RAS and CAS control data for initiating the memory access, since clock domain 60 will be off when the memory access is initiated. When the sideband control logic 88 receives RAS, but not CAS, control data, the sideband control logic 88 will turn on CAS clock domain 68 so that it is ready when the subsequent CAS signal is sent.

A standby power mode is initiated by an appropriate control packet to sideband logic 88. This will cause DLL 86 to transition from the nap mode to an ON mode via a control signal on line 92. At the same time, RAS clock domain 60 will be turned on by the same line 92 by enabling the gating of the clock signal through AND gate 94. Thus, in standby mode, clock receiver 84 and DLL 86 are on as well as RAS clock domain 60. When a RAS signal is received, it can be immediately processed by RAS logic 62. In anticipation of the subsequent CAS signal, control logic 62 will provide a signal on a line 96 to turn on CAS clock domain 68. This will automatically, or implicitly, turn on the CAS clock domain. Thus, the user need not send special commands to turn on and off the clock domains but rather it is done automatically in accordance with the initiation of a memory access at the appropriate time. The signal on line 96 is sent after a period of time corresponding to the latency of the CAS signal with respect to the RAS signal. This period of time can be stored in a register in RAS control logic 62 or can be determined by the memory controller. The signal on line 96 activates receiver 72, and also turns on the CAS clock domain 68 by activating AND gate 98.

The registers for setting the latency for implicit control of clock power domains can be programmed upon device initialization, or can by dynamically varied. Alternately, instead of a register, the latency can simply be designed into the circuit.

When a CAS signal is received, it will either be a CASR (CAS read) or a CASW (CAS write) signal. If it is a CASW, CAS control logic 70 will activate the write data domain 74 via control line 100, after an appropriate latency corresponding to when the write data will be received from bus 18. Control line 100 turns on receiver 78, and also enables AND gate 102 to provide the clock signal to write data domain 74.

Similarly, for a CASR operation, CAS control logic 70 activates AND gate 106, via a signal on line 104, to provide a clock signal (TCLK) to read clock domain 80.

Thus, in the present invention, when the main control busses are in standby mode, memory accesses can be performed over the fast main control bus, with power mode transitions being implicitly controlled to make the power mode transitions transparent. In this way, core access latencies are overlapped with power turn-on latencies. By automatically turning on certain interface power modes when a particular core operation command is given, implicit power control is provided which minimizes latency and saves valuable control bandwidth (no explicit power control is needed). This will efficiently integrate power control into the memory access pipeline stream.

Figure 6:
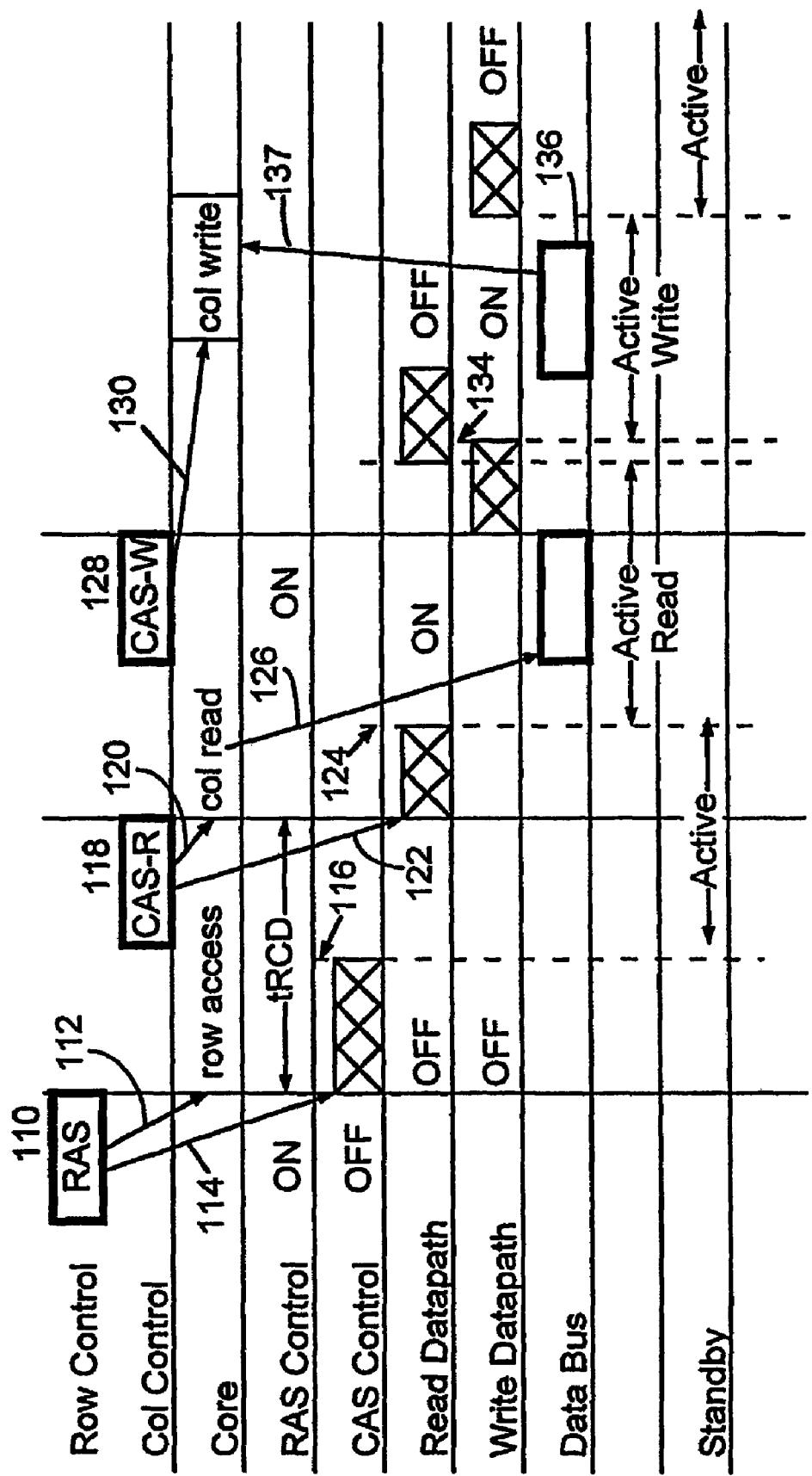
FIG. 6 is a timing diagram illustrating the sequencing of the clock domains of FIG. 5.

FIG. 6 illustrates these overlapped latencies. As shown in FIG. 6, the system of FIG. 5 is initially in a standby mode. When a RAS signal 110 is received, it will initiate the core row access as indicated by arrow 112. At the same time it will turn on the CAS clock domain as indicated by arrow 114. After a turn-on time and programmed latency, the CAS clock will be on at a point in time 116. At this point, the device is in what is considered an "active" mode. This turn-on time 116 is in advance of receiving a CASR signal 118 in its normal, pipeline timing. CAS-R signal 118 initiates a column read as indicated by arrow 120. The column read is initiated at a time tRCD after the row access, which is the latency of the row access. As also shown by an arrow 122, CASR signal 118 will also turn on the read data path after a time delay tDAC corresponding to the latency from the column read until the data is available. Thus, at a point in time 124, the read data path will be on (clock domain 80 of FIG. 5). The device will now be in "active read" mode. Again, the latency from the CAS-R signal to the read data path turn on time 124 matches the latency between the column read and when data is available as indicted by arrow 126.

For a write operation, similar latencies apply, as illustrated by CAS-W signal 128. This will initiate a column write operation as illustrated by arrow 130, and concurrently will provide a control signal as illustrated by line 132 to turn on the write data path. For a write operation, the data is coming in, and thus, the write data path must be turned on at a time 134 in advance of when the write data 136 is received over the data bus. Again, the latency of the power domain turn on of the write data path is transparent or hidden behind the latency of the write data arriving. The write data arriving is also pipelined so that it is not provided until needed for a column write in the memory core, as illustrated by arrow 137.

Slow Clock

Figure 7:
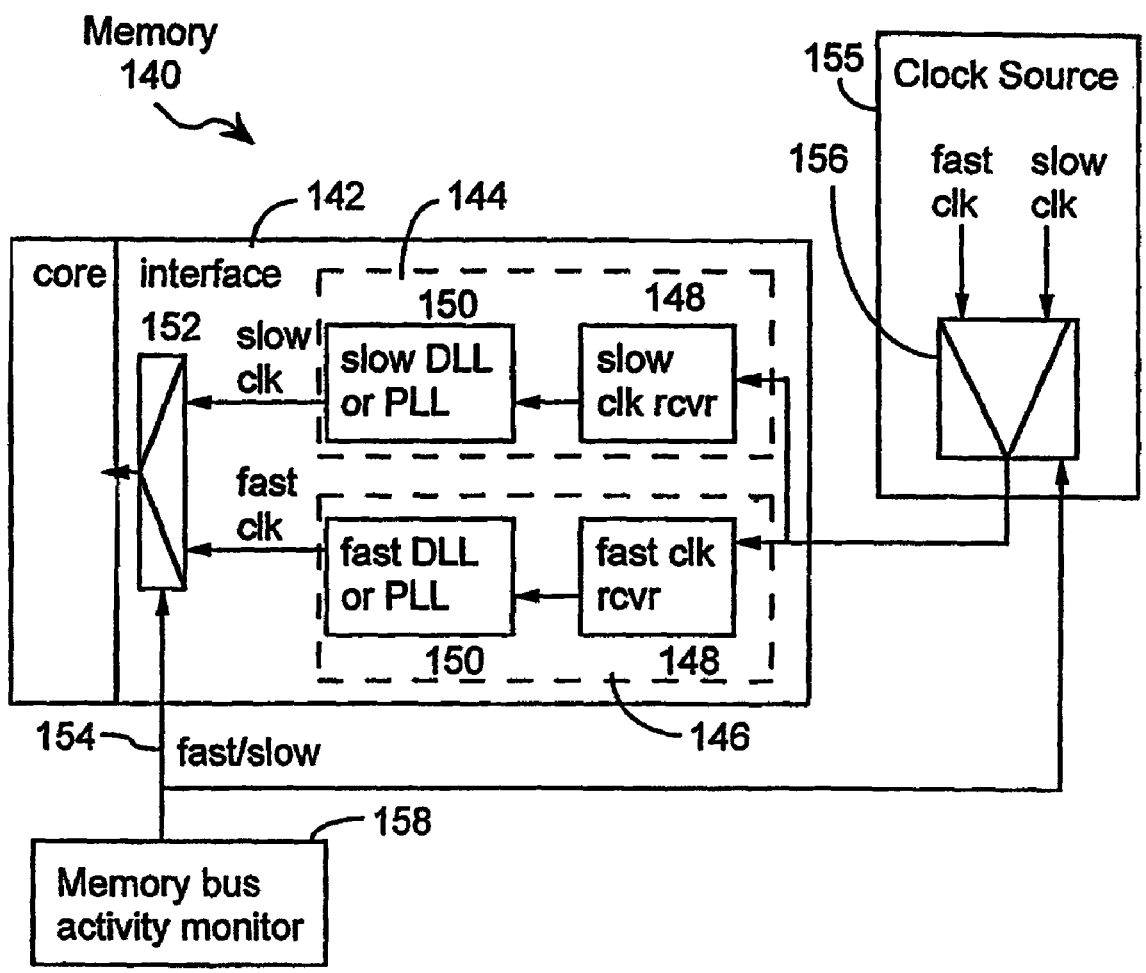
FIGS. 7, 8 and 9 illustrate three embodiments for dynamically varying the clock speed in accordance with data bandwidth.
Figure 8:
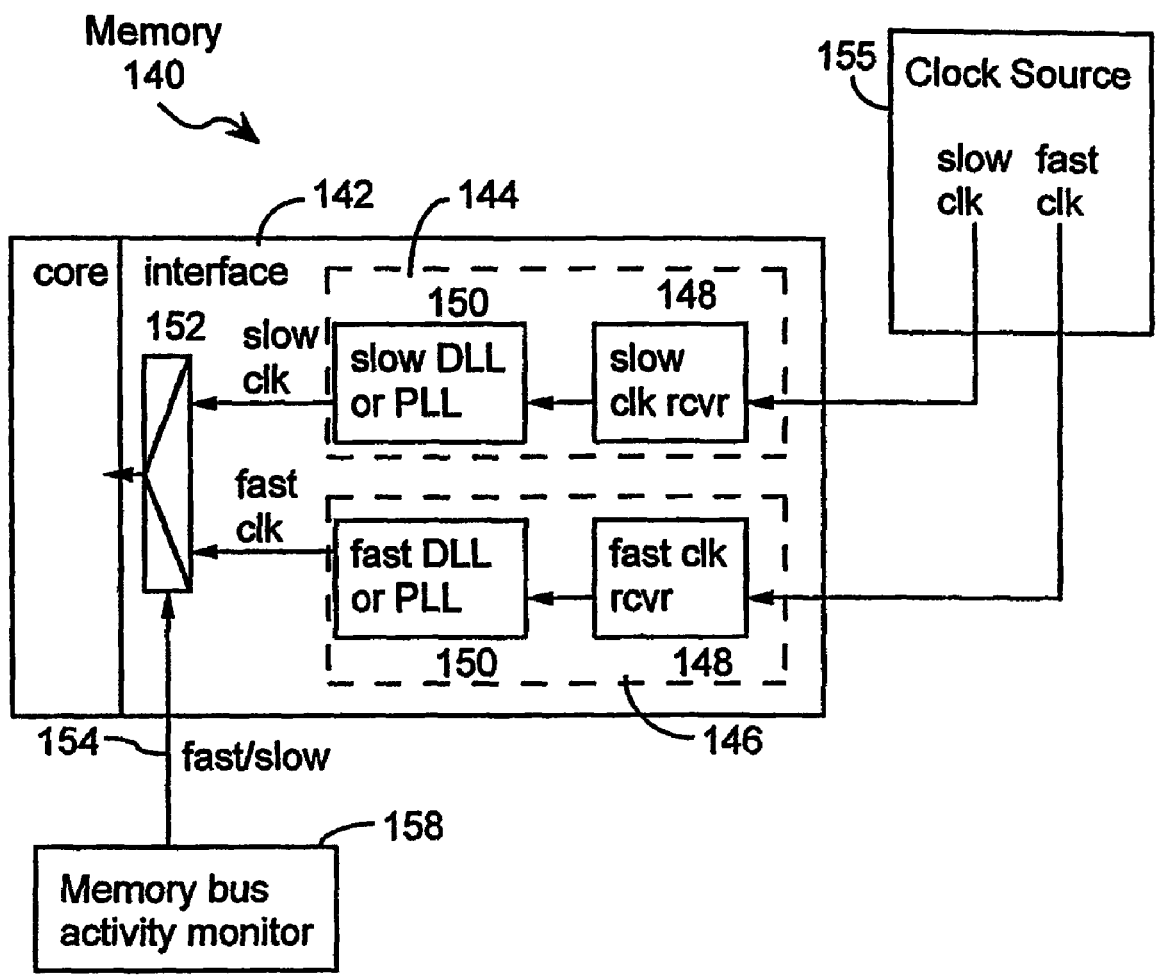
Figure 9:
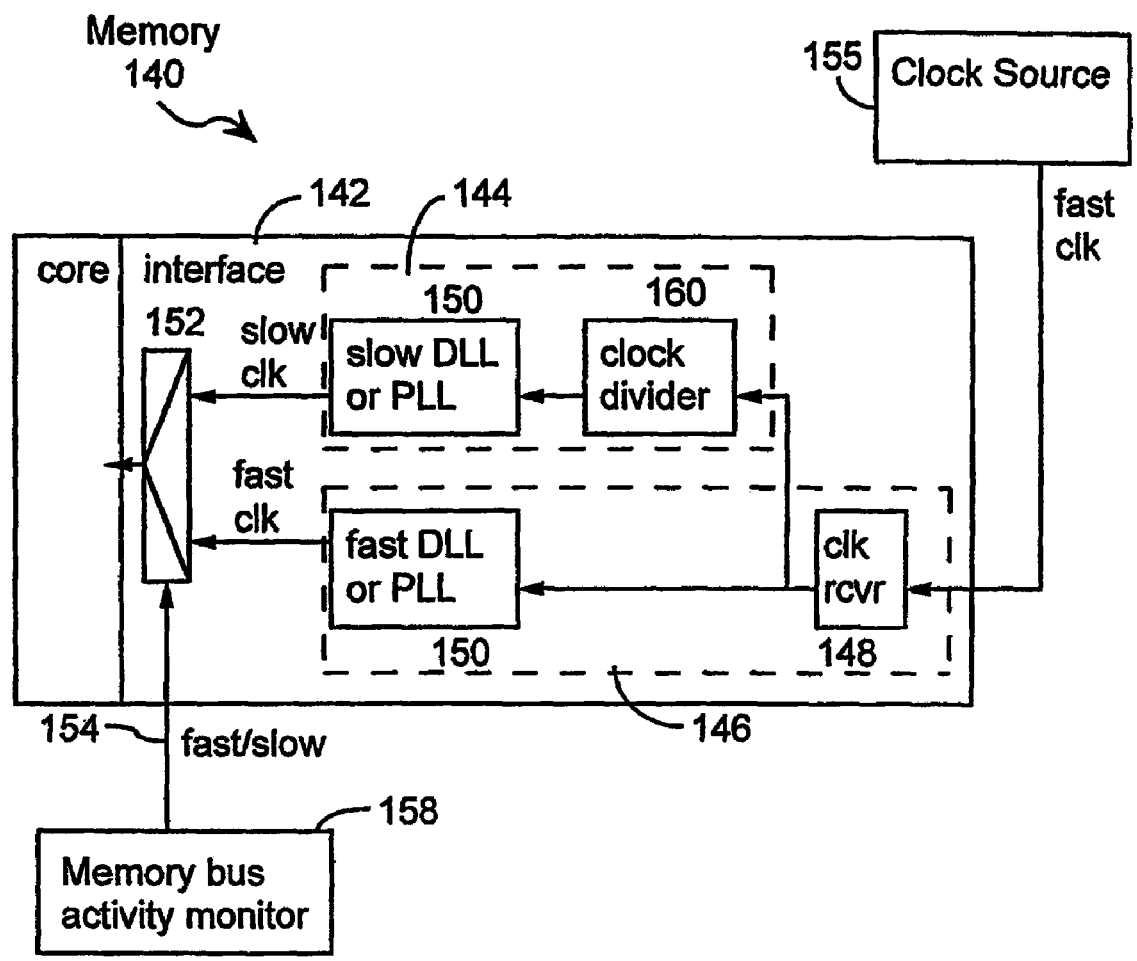

FIG. 7-9 illustrate embodiments of the invention which allow the clock provided over the main control bus to be dynamically varied from fast to slow in accordance with the data bandwidth requirements. In addition, a slow clock could be used to initiate a memory access operation without requiring the DLL 86 of FIG. 5 to be on, since the slower clock may not need synchronization. The slow clock would enable the access to be started concurrently with the CAS control clock domain being turned on.

A slower clock speed results in lower power because the AC power to switch the capacitive load connected to the clocks is reduced proportionately to the frequency. Also, at reduced clock speeds, the device may not require a high power phase compensation circuit (DLL or PLL), which is typically required for high speed operation. Depending on the slow clock frequency, the interface may operate without phase compensation or use a lesser performance phase compensation circuit which consumes less power.

FIG. 7 illustrates one embodiment in which a memory 140 has an interface 142 with a slow clock input circuit 144 and a fast clock input circuit 146. Each input circuit includes a clock receiver 148 and a DLL or PLL 150. A multiplexer 152 selects whether a fast or slow clock is being used via a select control line 154.

The clock source 155 itself provides both a fast clock and slow clock through a multiplexer 156.

A circuit 158 for selecting between the slow and fast clocks is preferably provided either in the controller or in a memory interconnect or some other device connected to the bus.

By monitoring bus traffic, the amount of bandwidth being used is determined by a monitor circuit 158. When bus traffic exceeds a predefined threshold (i.e., more than a predefined number of memory accesses per second), the monitor circuit selects the fast clock, and otherwise it selects the slow clock. Depending on which clock is used, the fast or slow DLL or PLL and the unused receiver are preferably turned off to conserve power. In one embodiment, the monitor circuit 158 may be implemented using a programmed microprocessor, external to the memory circuit.

As referred to above, on a transition from a slow clock to a fast clock usage, during the latency of the fast clock turn on, operations can be occurring using the slow clock.

FIG. 8 is a variation of the circuit of FIG. 7 where two separate clock inputs are used, rather than a single, multiplexed line for the clock input.

FIG. 9 illustrates an alternate embodiment in which a single external fast clock is provided, which is internally divided using a clock divider circuit 160 to produce the slow clock.

As will be understood by those skilled in the art, the present invention may be embodied in other specific forms without departing from the spirit or central characteristics thereof. Accordingly, the foregoing description is intended to be illustrative, but not limiting, of the scope of the invention which is set forth in the following claims.

What is claimed is:

1. A dynamic random access memory (DRAM) chip, comprising:
   a clock receiver to receive a clock signal;
   a command interface to receive a command that specifies a write operation, wherein the command interface receives the command using the clock signal;
   a data interface to receive data associated with the write operation after a programmable latency period transpires from when the command is received; and
   an interface to receive power mode information that controls transitions between a plurality of power modes, wherein for each power mode of the plurality of power modes, less power is consumed than the amount of power consumed during the write operation, the plurality of power modes comprising:
      a mode in which the clock receiver is on and the data interface is off; and
      a mode in which the clock receiver is off and the data interface is off.

2. The DRAM chip of claim 1, wherein:
   the mode in which the clock receiver is on and the data interface is off is a nap mode; and
   the mode in which the clock receiver is off and the data interface is off is a power down mode.

3. The DRAM chip of claim 2, further comprising a locked loop circuit, wherein:
   during the nap mode, the locked loop circuit is in a lower power consumption configuration than when the locked loop circuit is on; and
   during the power down mode, the locked loop circuit is off.

4. The DRAM chip of claim 1, wherein the command interface is configured to receive address information associated with the write operation.

5. The DRAM chip of claim 4, wherein the command interface is further configured to receive a column control packet that includes both the command that specifies the write operation and the address information.

6. The DRAM chip of claim 1, further configured to receive a control packet containing the power mode information via a sideband interface.

7. The DRAM chip of claim 1, wherein the DRAM chip is a Rambus DRAM chip (RDRAM).

8. A dynamic random access memory (DRAM) chip, comprising:
   a memory core;
   a clock receiver;
   a command interface to receive a command that specifies a write operation during which the DRAM chip inputs data, the write operation consuming an amount of power;
   a data interface to receive the data associated with the write operation after a programmable latency period from when the command is received; and
   an interface to receive a signal that indicates a transition to an operating mode in which less power is consumed than the amount of power consumed during the write operation, wherein the transition is one of a plurality of transitions comprising:
      a transition in which, while the clock receiver is on, the command interface is turned off and the data interface is turned off; and
      a transition in which the clock receiver is turned off, the command interface is turned off, and the data interface is turned off.

9. The DRAM chip of claim 8, wherein:
   the transition in which, while the clock receiver is on, the command interface is turned off and the data interface is turned off is a transition from an active mode to a nap mode; and
   the transition in which the clock receiver is turned off, the command interface is turned off, and the data interface is turned off is a transition from an active mode to a power down mode.

10. The DRAM chip of claim 9, further comprising a locked loop circuit, wherein:
    during the nap mode, the locked loop circuit is in a lower power consumption configuration than when the locked loop circuit is on; and
    during the power down mode, the locked loop circuit is off.

11. The DRAM chip of claim 8, further configured to receive address information associated with the write operation.

12. The DRAM chip of claim 11, further configured to receive a column control packet that includes both the command that specifies the write operation and the address information.

13. The DRAM chip of claim 8, wherein the DRAM chip is a Rambus DRAM chip (RDRAM).

14. A dynamic random access memory (DRAM) chip, comprising:
    a clock receiver;
    a locked loop circuit;
    a command interface, to receive a command that specifies a write operation during which the DRAM chip inputs data, the write operation consuming an amount of power; and a data interface separate from the command interface, to receive data associated with the write operation, after a programmable latency period from when the command is received; and an interface to receive information that controls transitions between a plurality of power modes, the power modes comprising:

a mode in which the clock receiver is on, the data interface is off and the locked loop circuit is on; and a mode in which the clock receiver is off, the data interface is off, the locked loop circuit is off, and the command interface is off.

15. The DRAM chip of claim 14, wherein:

the mode in which the clock receiver is on, the data interface is off, and the locked loop circuit is on is a standby mode; and the mode in which the clock receiver is off, the data interface is off, and the locked loop circuit is off is a power down mode.

16. The DRAM chip of claim 14, further configured to receive address information associated with the write operation.

17. The DRAM chip of claim 16, further configured to receive a column control packet that includes both the command that specifies the write operation and the address information.

18. The DRAM chip of claim 14, further configured to receive a control packet containing the power mode information via a sideband interface.

19. The DRAM chip of claim 14, wherein the DRAM chip is a Rambus DRAM chip (RDRAM).

20. A dynamic random access memory (DRAM) chip, comprising:

a memory core;
a locked loop circuit;
a clock receiver circuit to receive an external clock signal;
a first interface configured to receive a command that specifies a write operation;
a second interface that is separate from the first interface, configured to receive write data associated with the write operation after a programmable latency period transpires from when the command is received by the first interface; and
a respective interface configured to receive power mode information that specifies a mode selected from the group of modes comprising:
a first mode in which the clock receiver, the first interface, and the second interface are off;
a second mode in which the clock receiver is on, the first interface and the second interface are off, and the locked loop circuit is in a first power state; and
a third mode in which the clock receiver is on, second interface is off, and the locked loop circuit is in a second power state.

21. The DRAM chip of claim 20, wherein:
the first mode is a power down mode;
the second mode is a nap mode; and
the third mode is a standby mode.

22. The DRAM chip of claim 20, wherein:
the first power state of the locked loop circuit is a low power mode; and
the second power state of the locked loop circuit is an on state.

23. The DRAM chip of claim 20, further configured to receive address information associated with the write operation.

24. The DRAM chip of claim 23, further configured to receive a column control packet that includes both the command that specifies the write operation and the address information.

25. The DRAM chip of claim 20, further configured to receive a control packet containing the power mode information.

26. The DRAM chip of claim 20, wherein the DRAM chip is a Rambus DRAM chip (RDRAM).

27. A dynamic random access memory (DRAM) chip, comprising:

a memory core;
a locked loop circuit;
a clock receiver circuit to receive an external clock signal;
a command interface configured to receive a command that specifies a write operation
a data interface configured to receive write data associated with the write operation after a programmable latency period transpires from when the command is received by the command interface; and
a respective interface to receive power mode information that specifies a mode selected from the group of modes comprising:
a first mode in which the clock receiver, the command interface, and the data interface are off;
a second mode in which the clock receiver is on, the command interface and the data interface are off, and the locked loop circuit is in a first power state; and
a third mode in which the clock receiver is on, the data interface is off, and the locked loop circuit is in a second power state.

28. The DRAM chip of claim 27, wherein:
the first mode is a power down mode;
the second mode is a nap mode; and
the third mode is a standby mode.

29. The DRAM chip of claim 27, wherein:
the first power state of the locked loop circuit is a low power mode; and
the second power state of the locked loop circuit is an on state.

30. The DRAM chip of claim 27, further configured to receive address information associated with the write operation.

31. The DRAM chip of claim 30, further configured to receive a column control packet that includes both the command that specifies the write operation and the address information.

32. The DRAM chip of claim 27, further configured to receive a control packet containing the power mode information via a sideband interface.

33. The DRAM chip of claim 27, wherein the DRAM chip is a Rambus DRAM chip (RDRAM).

* * * * *

UNITED STATES PATENT AND TRADEMARK OFFICE
CERTIFICATE OF CORRECTION

PATENT NO. : 8,305,839 B2  
APPLICATION NO. : 13/352177  
DATED : November 6, 2012  
INVENTOR(S) : Tsern et al.

Page 1 of 1

It is certified that error appears in the above-identified patent and that said Letters Patent is hereby corrected as shown below:

Title Page, (63) Related Application Data, line 1, please delete "12/975,332" and add -- 12/975,322 --.

Signed and Sealed this
First Day of January, 2013

David J. Kappos
*Director of the United States Patent and Trademark Office*